US012593630B2

(12) United States Patent
Badala' et al.

(10) Patent No.: US 12,593,630 B2
(45) Date of Patent: Mar. 31, 2026

(54) PROCESS FOR MANUFACTURING A SILICON CARBIDE DEVICE AND SILICON CARBIDE DEVICE

(71) Applicant: STMICROELECTRONICS S.r.l., Agrate Brianza (IT)

(72) Inventors: Paolo Badala', Acireale (IT); Massimo Boscaglia, San Giovanni la Punta (IT); Domenico Pierpaolo Mello, Catania (IT); Anna Bassi, Gravina di Catania (IT); Valentina Scuderi, Catania (IT); Giovanni Franco, Viagrande (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 88 days.

(21) Appl. No.: 17/962,135

(22) Filed: Oct. 7, 2022

(65) Prior Publication Data

US 2023/0131049 A1 Apr. 27, 2023

(30) Foreign Application Priority Data

Oct. 21, 2021 (IT) ........................ 102021000027101

(51) Int. Cl.
*H01L 21/02* (2006.01)
*H01L 21/324* (2006.01)
(52) U.S. Cl.
CPC .. *H01L 21/02167* (2013.01); *H01L 21/02175* (2013.01); *H01L 21/02425* (2013.01); *H01L 21/02502* (2013.01); *H01L 21/324* (2013.01)
(58) Field of Classification Search
CPC ...... C01B 33/06; C23C 16/42; C23C 14/0635
See application file for complete search history.

(56) References Cited

U.S. PATENT DOCUMENTS

2006/0273323 A1 12/2006 Yamamoto et al.
2014/0061674 A1 3/2014 Imai
(Continued)

FOREIGN PATENT DOCUMENTS

CN 101263581 A 9/2008
EP 2993690 A1 3/2016
(Continued)

OTHER PUBLICATIONS

P. Acosta Alba et al., "Nanosecond Laser Annealing for Phosphorous Activation in Ultra-Thin Implanted Silicon-On-Insulator Substrates," 2016 21st International Conference on Ion Implantation Technology (IIT), Tainan, Taiwan, 2016 (Year: 2016).*

*Primary Examiner* — Christine S. Kim
*Assistant Examiner* — Cole Leon Lindsey
(74) *Attorney, Agent, or Firm* — Seed Intellectual Property Law Group LLP

(57) ABSTRACT

A process for manufacturing a silicon carbide device from a body of silicon carbide having a back surface, wherein a first layer of a first metal is formed on the back surface of the body; a second layer of a second metal, different from the first metal, is formed on the first layer to form a multilayer, the first or the second metal being nickel or a nickel alloy and forming a nickel-based layer, another of the first or the second metal being a metal X, capable to form stable compounds with carbon and forming an X-based layer; and the multilayer is annealed to form a mixed layer including nickel silicide and at least one of X carbide or a metal X-carbon ternary compound.

20 Claims, 4 Drawing Sheets

(56) References Cited

U.S. PATENT DOCUMENTS

| | | | |
|---|---|---|---|
| 2015/0255362 A1* | 9/2015 | Konrath ............... | H10D 30/668 |
| | | | 257/272 |
| 2016/0087061 A1* | 3/2016 | Imai ....................... | H10D 64/62 |
| | | | 257/77 |
| 2018/0301338 A1* | 10/2018 | Hilsenbeck ......... | H01L 23/3736 |
| 2020/0044031 A1 | 2/2020 | Pham et al. | |
| 2020/0258996 A1 | 8/2020 | Ohse | |
| 2021/0020754 A1 | 1/2021 | Nakazawa et al. | |
| 2022/0415655 A1 | 12/2022 | Badala' et al. | |
| 2023/0094592 A1 | 3/2023 | Badala' et al. | |

FOREIGN PATENT DOCUMENTS

| | | | |
|---|---|---|---|
| EP | 3131112 A1 | 2/2017 | |
| JP | 2009283754 A | 12/2009 | |
| RU | 188648 U1 | 4/2019 | |
| WO | WO 2015122065 A1 | 8/2015 | |
| WO | 2017025387 A1 | 2/2017 | |

* cited by examiner

PROCESS FOR MANUFACTURING A SILICON CARBIDE DEVICE AND SILICON CARBIDE DEVICE

BACKGROUND

Technical Field

The present invention is relative to a process for manufacturing a silicon carbide device and a silicon carbide device, obtained thereby.

Description of the Related Art

Silicon carbide (SiC) devices such as diodes (for example, Junction Barrier Schottky—JBS—diodes and Merged PiN Schottky—MPS—diodes) and MOSFETs, have better performances than silicon electronic devices, for example for power applications, where high operating voltages or other specific operating conditions, such as high temperature, are employed.

A silicon carbide device for power applications, hereinafter indicated as power device, generally comprises a silicon carbide body, a front metal region and a back metal region. In use, in an on condition of the device, a current flows through the silicon carbide body between the front metal region and the back metal region.

The power device may be obtained from a silicon carbide wafer having a front surface and a back surface, in one of its polytypes, such as 3C—SiC, 4H—SiC and 6H—SiC.

During initial manufacturing steps, devices like transistors, diodes, resistors, etc., are generally formed by forming operative regions in/on the silicon carbide body from/on the front surface.

Then, the front metal region is formed on the front surface to mutually interconnect the operative regions of the integrated devices as well as to allow connection of the power device with external circuit components and/or stages.

In addition, the back surface of the wafer is processed to form the back metal region.

To this end, a metal layer, e.g., nickel, is deposited on the back surface and caused to react with the silicon carbide of the wafer to form a nickel silicide layer, using a laser beam annealing or an RTA (Rapid Thermal Annealing) treatment.

Subsequently, a metal layer may be deposited on the silicide layer, thereby obtaining an ohmic contact at the back of the wafer.

After final manufacturing steps including dicing, the power device is obtained.

The inventors have noticed that, in some cases, the silicide layer of such known power devices is mechanically weak. In fact, during some reliability tests, it has been observed that the silicide layer has some probability of delamination from the silicon carbide body or mechanical fracture, thereby causing failure of the power device.

BRIEF SUMMARY

The present invention overcomes, among others, the disadvantages of the some silicon carbide based power devices.

According to the present invention, there are provided a process for manufacturing a silicon carbide device and a silicon carbide device.

BRIEF DESCRIPTION OF THE SEVERAL VIEWS OF THE DRAWINGS

For the understanding of the present invention, embodiments thereof are now described, purely as a non-limitative example, with reference to the enclosed drawings, wherein.

DETAILED DESCRIPTION

This disclosure originates from a study of the inventors investigating the reasons of the failure of some silicon carbide based devices.

Such study by the inventors showed that the back metal layers of some silicon carbide devices tend to break at the interface with the silicon carbide body and noticed that, during nickel silicidation, carbon from silicon carbide body is segregated in the silicide layer, near an interface with the silicon carbide body, and form carbon nodules or clusters.

Figure 1:
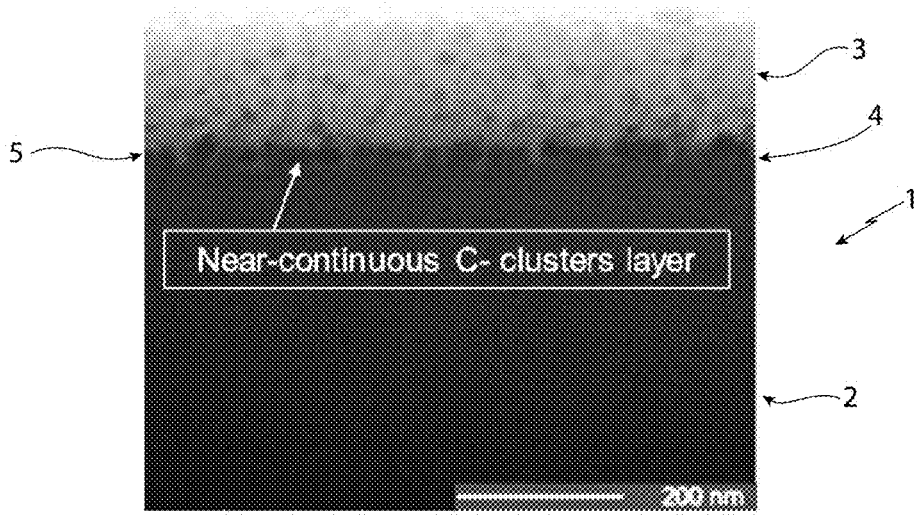
FIG. 1 is a micrograph of a cross-section through a portion of a silicon carbide device.

This phenomenon is shown in FIG. 1, which shows a portion of a die 1, comprising a SiC body 2 and a nickel silicide layer 3; an interface between the SiC body 2 and the nickel silicide layer 3 is indicated by 4.

FIG. 1 also shows an agglomeration of carbon clusters in the nickel silicide layer 3, forming a carbon cluster layer 5 that extends, almost continuously, near interface 4.

The inventors thus identified the carbon cluster layer 5 as a mechanical weakness of the die 1, which may cause delamination and brittle fracture of the silicide layer 3.

The manufacturing process of the current disclosure avoids the formation of carbon clusters.

In some embodiments, a nickel based layer and a carbon capturing layer are deposited on the back surface of the body, the deposited bilayer is treated with annealing, and a reaction between the bilayer and the SiC body occurs, generating a silicide layer that does not accommodate carbon clusters.

The carbon capturing layer forms stable compounds with carbon. In some embodiments, a titanium alloy is used as the carbon capturing layer. During annealing, segregated carbon diffuses towards the titanium layer and stably links with it, forming TiC (titanium carbide) and/or ternary compounds of Ti and C (such as $Ti_xSi_yC_z$) grains, eliminating any carbon cluster in the silicide layer being formed.

Other possible carbon capturing layers may be based on alloys of chromium, aluminium and tantalum.

In some embodiment, the ratio between the thicknesses of the nickel based layer and the carbon capturing based layer is lower than 1.7, in some embodiments, lower or equal to 1.5 to surely avoid formation of clusters.

Hereinafter, an embodiment of a process to form a carbon-cluster free silicon carbide device will be described in further details.

Figure 2:
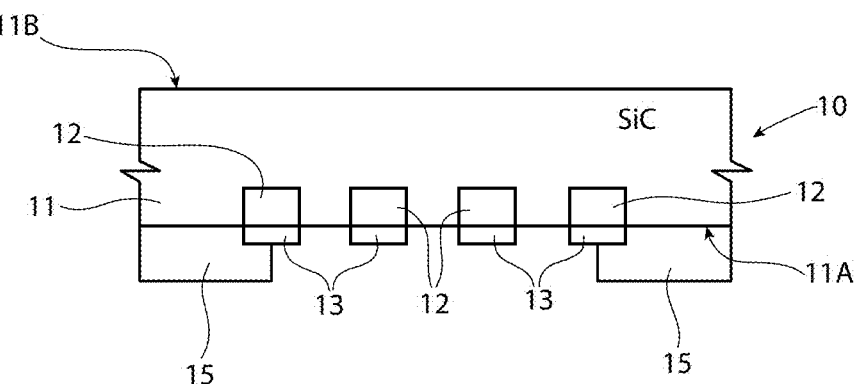
FIGS. 2-5 show cross-sections of a silicon carbide wafer, in subsequent steps for manufacturing a silicon carbide device, according to the present manufacturing process.

FIG. 2 shows a wafer 10 that has already been subject to first manufacturing steps.

The wafer 10 comprises a body 11 of silicon carbide (SiC) in one of its polytypes, such as 3C—SiC, 4H—SiC and 6H—SiC, having (after being thinned, see below) a first surface 11A and a second surface 11B.

For example, the body 11 may be a SiC substrate or a SiC substrate covered by an epitaxial layer and, before thinning, may have a thickness comprised for example between 275 μm and 375 μm, in some embodiments, about 350 μm.

Current conduction regions 12 have already been formed in the body 11, e.g., implanted, and metal connection regions 13 have already been formed on the first surface 11A of the body 11.

The body 11 may comprise a drift layer; the current conduction regions 12 may form, for example, source regions and body regions, depending on the specific application.

In an embodiment, the body 11 may also comprise gate structures or gate structures formed over the first surface 11A. In another embodiment, the body 11 may be a multilayer, with different device structures integrated in the various layers.

The connection regions 13 may comprise one or more metal layers that form an electrical interconnect structure for the current conduction regions 12.

Any gates structures may be formed on the first surface 11A or in the body 11.

In addition, passivation structures 15 of insulating material have been already formed on the first surface 11A of the body 11.

The body 11 has already been subject to a thinning to obtain a final thickness comprised, for example, between 100 μm and 250 μm, for example of about 180 μm.

Figure 3:
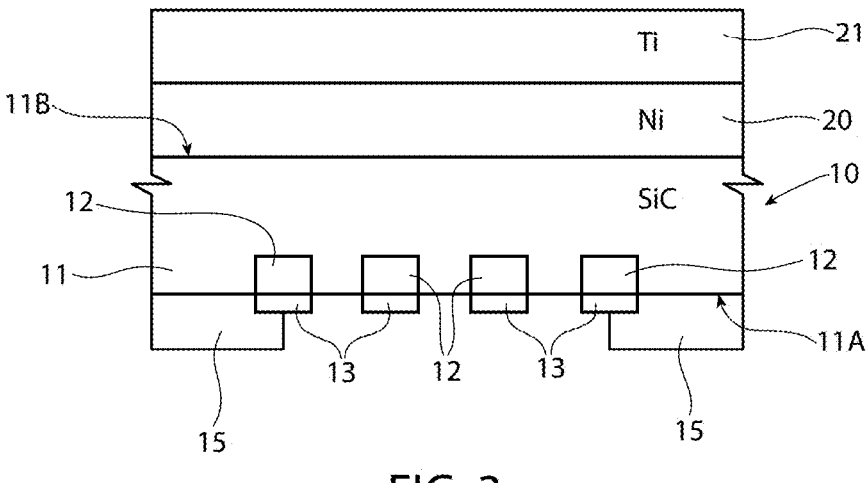

Then, FIG. 3, a first contact layer 20 is deposited on the second surface 11B of the body 11. The first contact layer 20 may be of a nickel based material, for example of nickel or a nickel alloy, such as a silicon nickel alloy ($Ni_xSi_y$).

Thereafter, a second contact layer 21 is deposited on the first contact layer 20. The second contact layer 21 may be of titanium Ti, chromium Cr, aluminium Al, or tantalum Ta.

The deposition order of the first and the second contact layers 20, 21 may be inverted. In some embodiment, in a case that the second layer 21 is of aluminium, the second contact layer 21 is deposited first and the first contact layer 20 is deposited after the second contact layer 21. The deposition sequence between the first contact layer 20 and the second contact layer 21 may be determined to avoid any possible reflection in a subsequent annealing step, as discussed hereinbelow.

Both layers 20 and 21 may be deposited by sputtering.

The thickness of both the first contact layer 20 and the second contact layer 21 may be comprised between 10 nm and 75 nm.

In case the first contact layer 20 is of a nickel based material, and the second contact layer 21 is of a titanium-, chromium-, aluminium-, or tantalum-based material, in some embodiments, the thickness ratio between the first and the second contact layers 20, 21 is lower than 1.7.

For example, the thickness ratio between the first and the second contact layers 20, 21 may vary between 0.3 and 1.5.

In case the first contact layer 20 is of a titanium-, chromium-, aluminium-, or tantalum-based material and the second contact layer 21 is of a nickel based material, in some embodiments, the thickness ratio is inversed and may vary between 0.67 and 3.33.

Figure 4:
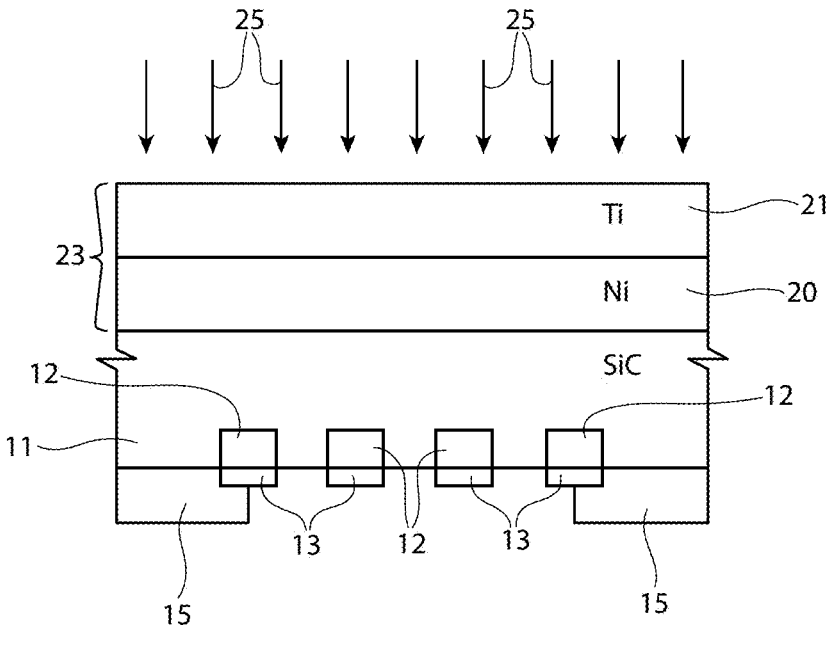

Thereby, a bilayer 23 is obtained, including the layer 20 and the layer 21, having a thickness comprised between 20 and 150 nm, FIG. 4.

Then, an annealing procedure, e.g., RTA or laser annealing (for example UV laser annealing) is performed on the bilayer 23, as shown in FIG. 4 by arrows 25. For example, the laser annealing may be done with an energy density comprised between 3.4 $J/cm^2$ and 4.8 $J/cm^2$, in some embodiments, of 4 $J/cm^2$, at a wavelength comprised between 290 nm and 370 nm, in some embodiments, at 310 nm; pulse duration comprised between 100 ns and 300 ns, in some embodiments, of 160 ns; and by repeating the pulses between 1 and 5 times.

Annealing causes a reaction between the silicon carbide near the second surface 11B of the body 11 and the bilayer 23.

During the annealing, silicon atoms mainly react with nickel and form nickel silicide; in addition, carbon atoms from the body 11 migrate into the bilayer 23 and react with titanium, forming stable TiC compounds (titanium carbide) and ternary compounds of Ti and C (such as $Ti_xSi_yC_z$).

Figure 5:
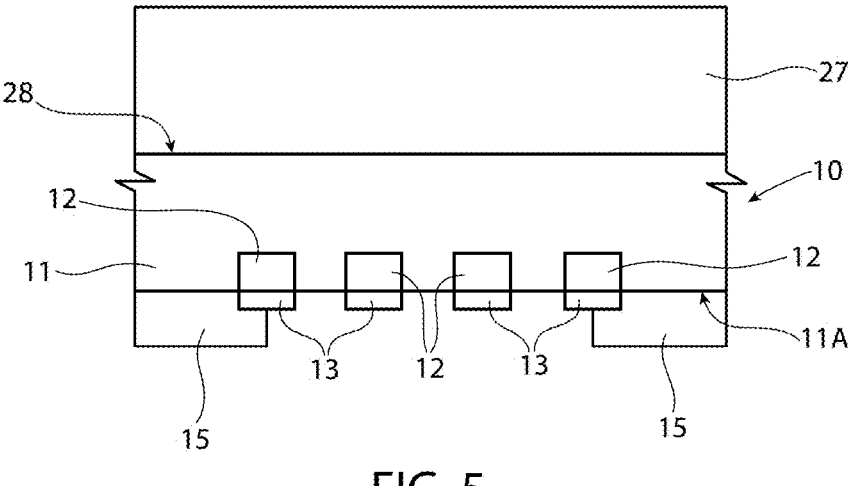

Therefore, a mixed silicide layer 27 is formed, as shown in FIG. 5.

Mixed silicide layer 27 forms an interface 28 with the body 10, different from the second surface 11B, due to the reaction of the body 11 with the bilayer 23.

In some embodiments, mixed silicide layer 27 contains Ni silicide grains, TiC compounds, and other various compounds (e.g., but not limited to, compound $Ti_xSi_yC_z$).

In some embodiments, after annealing, an etching may be carried out, to remove titanium, chromium, aluminium, tantalum, their carbides and any unreacted nickel arranged on the surface of the mixed silicide layer 27.

Thereby, a conductive layer (still indicated at 27) is obtained that is suitable to operate as an ohmic contact at the back.

Then, a final metal layer (not shown) may be deposited on the mixed silicide layer 27, for example of Ti/NiV/Ag.

The wafer 10 is then subject to final manufacturing steps, including dicing, thereby forming an electronic device.

Figure 6:
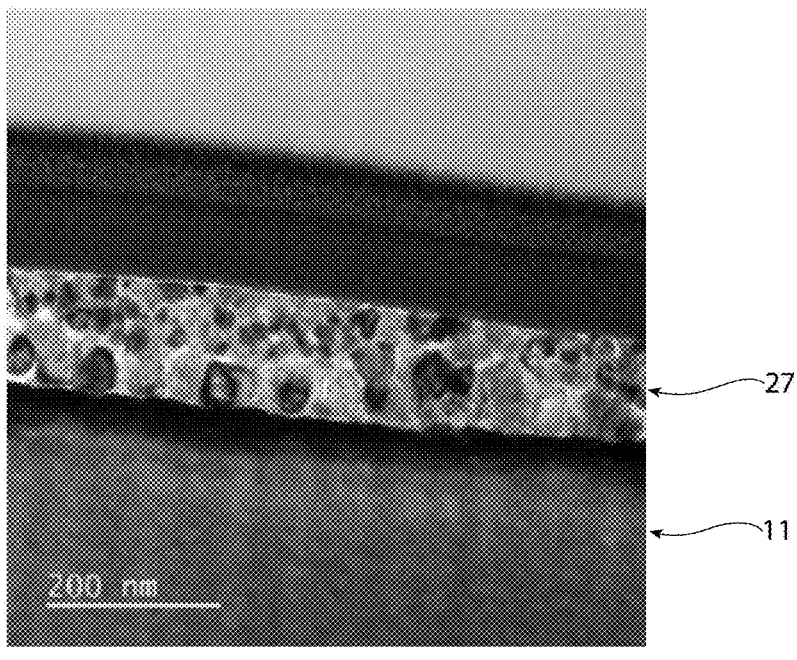
FIG. 6 is a micrograph of a cross-section through a portion of the silicon carbide device after the manufacturing step of FIG. 5.

FIG. 6 is a TEM (Transmission Electron Microscopy) image of a cross-section of a detail of the wafer 10 of FIG. 5, at the mixed silicide layer 27, obtained in case of a thickness ratio of 0.7.

Figure 7:
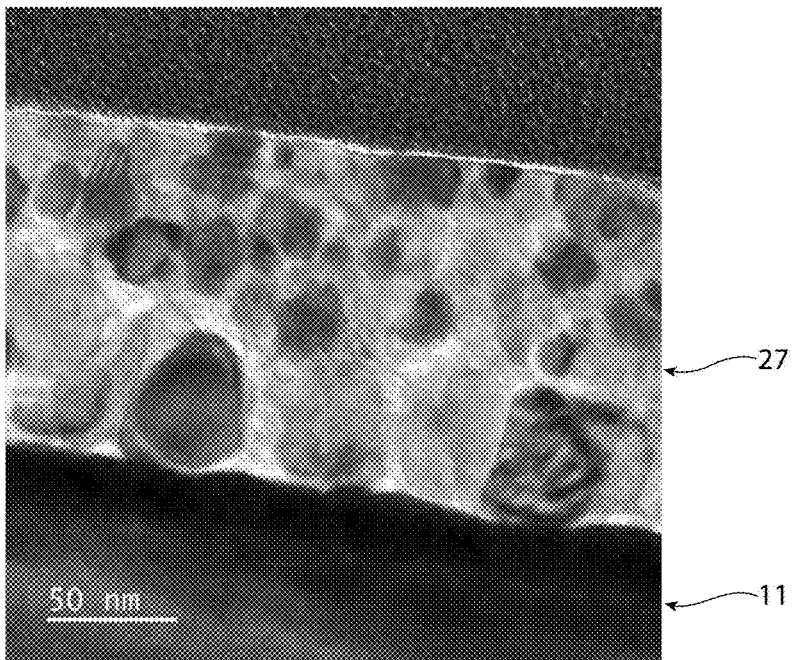
FIG. 7 is an enlarged detail of the micrograph of FIG. 6.

As visible in the enlarged detail of the example TEM image of FIG. 7, no carbon clusters are present at the interface 28 between the body 11 of silicon carbide and the mixed silicide layer 27.

Figure 8:
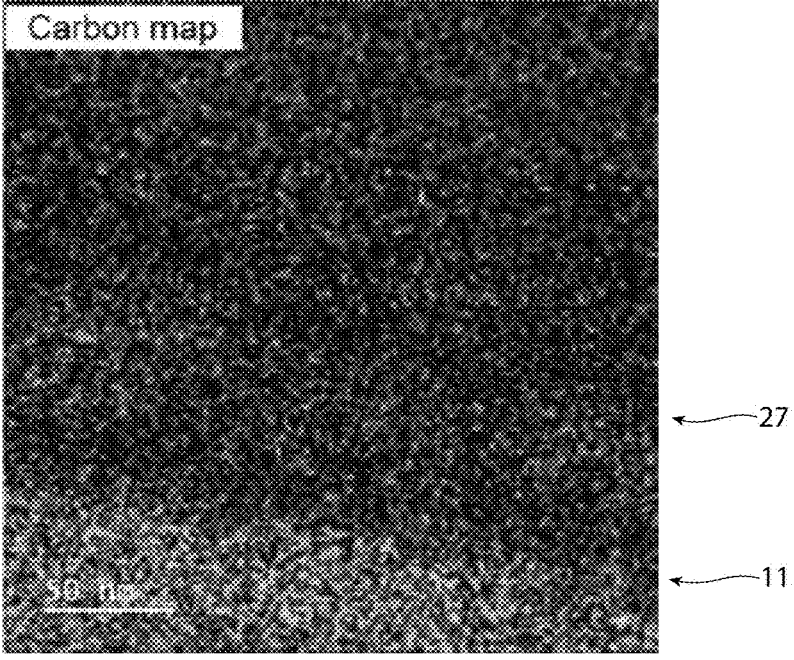
FIG. 8 is a carbon map of a portion of the detail of FIG. 7.

This is confirmed also by the carbon chemical map of FIG. 8, obtained from the image of FIG. 7 by electron spectroscopic imaging techniques using electron energy loss filter in which the energy acquisition window was set around the specific value of C K-edge.

Analogue results have been obtained with thickness ratios of 0.3, 1 and 1.5, whereas for a Ni/Ti a ratio of 1.7, the inventors observed initial formation of some carbon clusters near the interface 28 with the body 11, even if these carbon clusters do not form a continuous line.

Experiments of the inventors also showed that, by virtue of the present process, the electronic device is not subject to delamination or failure for the breakage of the metal layer (mixed silicide layer) 27.

Therefore, a high mechanical strength of the electronic device is obtained.

Finally, it is clear that numerous variations and modifications may be made to the device and process described and illustrated herein, all falling within the scope of the invention as defined in the attached claims.

For example, as above indicated, titanium, chromium, aluminium and tantalum may be used as carbon capturing metals, since they are able to stable compounds with carbon.

In addition, as indicated, the first and the second contact layer 20, 21 may be inverted, to have a first layer 20 of a Ti, Cr, Al, or Ta alloy and a second layer 21 of a nickel alloy.

A process for manufacturing a silicon carbide device from a body (11) including silicon carbide and having a back surface (11B), the process may be summarized as including forming a first layer (20) of a first metal on the back surface of the body; forming a second layer (21) of a second metal, different from the first metal, on the first layer to form a multilayer (23), the first or the second metal being nickel or a nickel alloy and forming a nickel-based layer, another of the first and the second metal being an X metal or an X-metal alloy capable to form stable compounds with carbon and forming an X metal-based layer; and annealing the multilayer (23) to form a mixed layer (27) including nickel silicide and at least one of X carbide or a metal X-carbon ternary compound.

The other metal may be chosen among titanium, chromium, aluminium and tantalum.

The nickel-based layer may have a first thickness, the X metal-based layer has a second thickness and a ratio first thickness/second thickness is lower than 1.7.

The ratio first thickness/second thickness may be between 0.3 and 1.5.

The multilayer (23) may have a thickness comprised between 20 nm and 150 nm.

The nickel-based layer may have a thickness between 10 nm and 75 nm and the X metal-based layer has a thickness comprised between 10 nm and 75 nm.

Annealing may be chosen between laser annealing and RTA annealing.

Laser annealing may include using an energy density comprised between 3.4 J/cm$^2$ and 4.8 J/cm$^2$, at a wavelength between 290 nm and 370 nm; with pulse duration between 100 ns and 300 ns; and wherein the pulses are repeated between 1 and 5 times.

The process may further include etching the mixed layer to remove superficial unreacted X metal, X carbide, and unreacted nickel.

A silicon carbide device, may be summarized as including a body (11) including silicon carbide and having a back surface; and a contact region (27) extending on the back surface (28) of the body, the contact region (27) is a mixed layer comprising nickel silicide and at least one of X carbide or a metal X-carbon ternary compound, wherein X is a metal different from nickel.

X may be chosen among titanium, chromium, aluminium and tantalum.

The mixed layer (27) may form an interface (28) with the body (11) and the mixed layer has no carbon cluster near the interface.

The various embodiments described above can be combined to provide further embodiments. Aspects of the embodiments can be modified, if necessary to employ concepts of the various embodiments to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method for manufacturing a silicon carbide device, the method comprising:

forming a multilayer on a first surface of a silicon carbide body opposite a second surface, the second surface including a plurality of metal connection regions that are separated from each other by a plurality of spaces; and forming first and second passivation structures overlapping a first and second metal connection region of the plurality of metal connection regions, the first and second passivation structures being separated by at least one of the plurality of spaces, each passivation structure having a first portion directly on the second surface of the silicon carbide body and a second portion separated from the second surface by the respective first or second metal connection region, the first and the passivation structures having outer surfaces that are substantially coplanar, wherein forming the multilayer includes forming a first layer having a first metal material and a second layer having a second metal material different from the first metal material, the first metal material including nickel; and forming a mixed layer including nickel silicide and at least one of a metal carbide of the second metal or a carbon ternary compound of the second metal by annealing the multilayer.

2. The method according to claim 1, wherein the second metal is chosen among titanium, chromium, aluminum and tantalum.

3. The method according to claim 1, wherein the first layer has a first thickness, the second layer has a second thickness and a ratio between the first thickness and the second thickness is lower than 1.7.

4. The method according to claim 3, wherein the ratio between the first thickness and the second thickness is in the range of 0.3 and 1.5.

5. The method according to claim 1, wherein the multilayer has a thickness in the range of 20 nm and 150 nm.

6. The method according to claim 1, wherein the first layer has a thickness in the range of 10 nm and 75 nm, and the second layer has a thickness in the range of 10 nm and 75 nm.

7. The method according to claim 1, wherein the annealing is laser annealing.

8. The method according to claim 7, wherein the laser annealing comprises using an energy density in the range of 3, 4 J/cm$^2$ and 4.8 J/cm$^2$, at a wavelength in the range of 290 nm and 370 nm, with a pulse duration in the range of 100 ns and 300 ns, wherein the pulses are repeated in the range of 1 and 5 times.

9. The method according to claim 1, further comprising etching the mixed layer to remove superficial unreacted second metal, the metal carbide, and unreacted nickel.

10. A method for manufacturing a silicon carbide device, the method comprising:

forming a multilayer on a first surface of a silicon carbide body opposite a second surface along a first direction, the second surface including a plurality of metal connection regions that are separated from each other by a plurality of spaces; and forming first and second passivation structures overlapping a first and second metal connection region of the plurality of metal connection regions along the first direction, the first and second passivation structures being separated by at least one of the plurality of spaces, each passivation structure having a first portion directly on the second surface of the silicon carbide body and a second portion separated from the second surface by the respective first or second metal connection region, the first portion being a first distance from the second surface and the second portion being a second distance from the second surface equal to the first distance, the multilayer including a first layer having a first metal material and a second layer having a second metal material different from the first metal material, the first metal material being nickel or a nickel alloy; and annealing the multilayer.

11. The method according to claim 10, wherein the second metal is one or more of titanium, chromium, aluminum and tantalum.

12. The method according to claim 10, wherein the first layer has a first thickness, the second layer has a second thickness and a ratio between the first thickness and the second thickness is lower than 1.7.

13. The method according to claim 12, wherein the ratio between the first thickness and the second thickness is in the range of 0.3 and 1.5.

14. The method according to claim 10, wherein the multilayer has a thickness in the range of 20 nm and 150 nm.

15. The method according to claim 10, wherein the first layer has a thickness in the range of 10 nm and 75 nm, and the second layer has a thickness in the range of 10 nm and 75 nm.

16. The method according to claim 10, wherein the annealing is one or more of laser annealing or rapid thermal annealing.

17. The method according to claim 10, further comprising etching the mixed layer configured to remove at least a portion of unreacted second metal, the metal carbide, and unreacted nickel.

18. A method comprising:

forming a multilayer on a first surface of a substrate opposite a second surface, the second surface including a plurality of metal connection regions and a passivation layer partially covering at least two of the plurality of metal connection regions, the passivation layer having a first gap entirely exposing at least one of the plurality of metal connection regions, the forming a multilayer including:

forming a first contact layer of a first metal on the first surface of the substrate; and forming a second contact layer of a second metal different than the first metal on the first contact layer;

forming a mixed silicide layer by annealing the multilayer; and forming a conductive layer by etching the mixed silicide layer.

19. The method according to claim 18, wherein the first and second contact layers are formed by sputtering.

20. The method according to claim 18, further comprising forming a metal layer on the mixed silicide layer.

* * * * *